(12) United States Patent
Hourne et al.

(10) Patent No.: US 12,095,453 B2
(45) Date of Patent: Sep. 17, 2024

(54) CAPACITIVE PROXIMITY SENSOR

(71) Applicant: Vitesco Technologies GmbH, Regensburg (DE)

(72) Inventors: Xavier Hourne, Toulouse (FR); Cédric Vergnieres, Toulouse (FR)

(73) Assignee: Vitesco Technologies Gmbh, Regensburg (DE)

( * ) Notice: Subject to any disclaimer, the term of this patent is extended or adjusted under 35 U.S.C. 154(b) by 0 days.

(21) Appl. No.: 18/284,352

(22) PCT Filed: May 10, 2022

(86) PCT No.: PCT/EP2022/062566
§ 371 (c)(1),
(2) Date: Sep. 27, 2023

(87) PCT Pub. No.: WO2022/248207
PCT Pub. Date: Dec. 1, 2022

(65) Prior Publication Data
US 2024/0275382 A1 Aug. 15, 2024

(30) Foreign Application Priority Data
May 25, 2021 (FR) ...................................... 2105382

(51) Int. Cl.
*G01V 3/08* (2006.01)
*G06F 3/044* (2006.01)
*H03K 17/955* (2006.01)

(52) U.S. Cl.
CPC ........... *H03K 17/955* (2013.01); *G01V 3/088* (2013.01); *G06F 3/044* (2013.01); *H03K 2217/960705* (2013.01); *H03K 2217/960725* (2013.01)

(58) Field of Classification Search
CPC ..... H03K 17/955; H03K 2217/960705; H03K 2217/960725; G01V 3/088; G06F 3/044
See application file for complete search history.

(56) References Cited

U.S. PATENT DOCUMENTS

| 9,542,051 | B2 | 1/2017 | Davison et al. |
| 10,191,591 | B2 | 1/2019 | Davison et al. |

(Continued)

FOREIGN PATENT DOCUMENTS

| FR | 3085177 A1 | 2/2020 |
| WO | 2016064438 A1 | 4/2016 |

OTHER PUBLICATIONS

International Search Report and Written Opinion for International Application PCT/EP2022/062566, mailed Sep. 13, 2022, 17 pages.

(Continued)

*Primary Examiner* — Amy He
(74) *Attorney, Agent, or Firm* — Buchanan, Ingersoll & Rooney PC

(57) ABSTRACT

A capacitive proximity sensor including a detection circuit, including a detection capacitor, a storage capacitor and switches, a DC voltage generator and a microcontroller which is configured to control the switches and to: obtain a voltage value across the terminals of the storage capacitor and across the terminals of the detection capacitor; calculate a first average defined by the average of the voltage values which are obtained at the end of each iteration of a first acquisition phase and a second average defined by the average of the voltage values at the end of each iteration of a second acquisition phase; and detect a human presence when the difference between the first average and the second average is above a predefined detection threshold.

4 Claims, 4 Drawing Sheets

(56) References Cited

U.S. PATENT DOCUMENTS

| | | | |
|---|---|---|---|
| 2008/0042660 A1* | 2/2008 | Ely | G06F 3/04166 |
| | | | 324/678 |
| 2013/0088242 A1 | 4/2013 | Lundstrum et al. | |
| 2013/0088372 A1 | 4/2013 | Lundstrum et al. | |
| 2016/0117875 A1* | 4/2016 | Duchemin | H03K 17/955 |
| | | | 340/5.72 |
| 2020/0048940 A1* | 2/2020 | Hourne | E05B 81/77 |

OTHER PUBLICATIONS

International Search Report and Written Opinion for International Application PCT/EP2022/062566, mailed Sep. 13, 2022, 15 pages (French).

English Translation of the Written Opinion for International Application No. PCT/EP2022/062566, mailed Sep. 13, 2022, 7 pages.

* cited by examiner

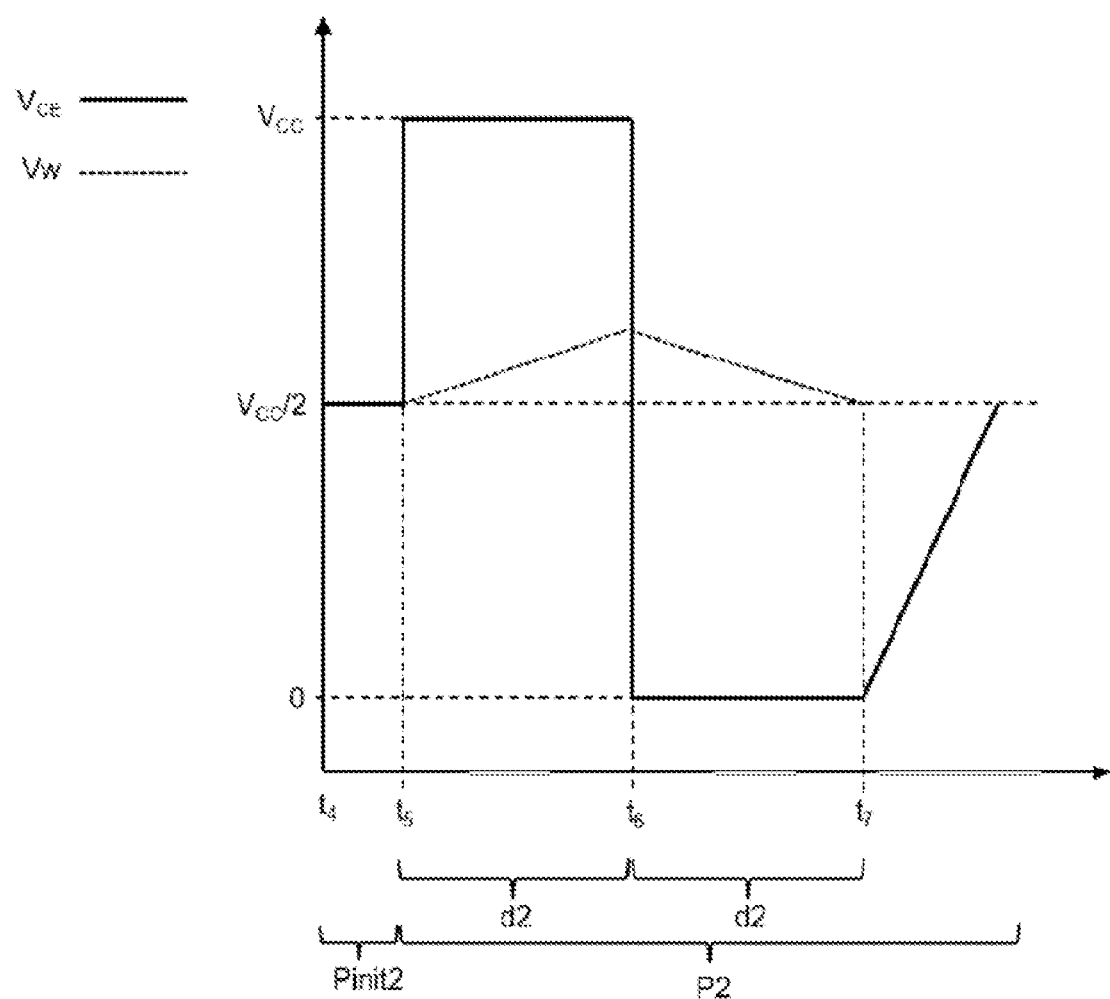

CAPACITIVE PROXIMITY SENSOR

CROSS REFERENCE TO RELATED APPLICATIONS

This application is the U.S. National Phase Application of PCT International Application No. PCT/EP2022/062566, filed May 10, 2022, which claims priority to French Patent Application No. 2105382, filed May 25, 2021, the contents of such applications being incorporated by reference herein.

FIELD OF THE INVENTION

The present invention relates to the field of capacitive sensors and notably concerns a capacitive proximity sensor and a method using such a sensor.

BACKGROUND OF THE INVENTION

In a motor vehicle, it is known practice to use capacitive sensors to detect a human presence and trigger functions of the vehicle. For example, it is known practice to mount a capacitive sensor in the handles of the opening elements, in order to detect the presence of the hand of a user of the vehicle and thus unlock the opening elements, or indeed under the trunk of the vehicle in order to detect the passing of a foot so as to open it.

Such detection is possible due to the fact that the proximity of a human body part increases the electrostatic field and therefore the capacitance value of a capacitor device. Thus, in a known solution, referred to as a "DCVD" (Differential Capacitive Voltage Divider), the capacitive sensor comprises an electrode connected to a detection circuit comprising capacitor devices and switches, and a microcontroller making it possible to control the switches so as to carry out measurements based on instructions stored in its memory area.

A measurement is divided into a series of successive analog-to-digital conversions, for example 8. The measurements are carried out by the microcontroller as soon as it is available, that is to say when the microcontroller is not in the process of processing instructions, the time between two measurements therefore not being predefined. For each measurement, the microcontroller periodically controls the switches so as to open and close, so as to fill a detection capacitor then empty it into a storage capacitor before measuring the voltage across the terminals of the storage capacitor in order to determine the value thereof. In the absence of a human presence in proximity to the sensor, the value of the detection capacitor remains below a certain threshold for a predetermined number of consecutive measurements, for example three. In the event of a human presence, the value of the detection capacitor exceeds the threshold for the predetermined number of consecutive measurements.

However, in the event of moisture or of rain, it may happen that the value of the detection capacitor also exceeds the threshold for the predetermined number of consecutive values. This causes false detections of a human presence and therefore inappropriate triggering of certain functions of the vehicle, such as the unlocking of the opening elements. It therefore proves useful to at least partially rectify these drawbacks.

SUMMARY OF THE INVENTION

To this end, an aspect of the invention concerns a capacitive proximity sensor comprising a detection circuit provided with a detection capacitor, with a storage capacitor and with switches, a DC voltage generator and a microcontroller which is configured to control the switches of the detection circuit, the microcontroller being noteworthy in that it is configured to:

a) during a first initialization phase, control the application of a voltage across the terminals of the detection capacitor, the value of which is equal to half of the voltage delivered by the DC voltage generator, b) during a first acquisition phase, iterated a number of times N, N being a natural number which is greater than or equal to three, following the first initialization phase, carry out the following sub-steps of:
  i) controlling the discharge of the detection capacitor over a first predefined duration, then
  ii) controlling the charge of the detection capacitor over said first predefined duration, then
  iii) controlling the transfer of the charge from the detection capacitor to the storage capacitor in order to obtain a voltage value across the terminals of the storage capacitor by analog-to-digital conversion, c) during a second initialization phase, following the first acquisition phase, control the application of a voltage across the terminals of the detection capacitor, the value of which is equal to half of the voltage delivered by the DC voltage generator, d) during a second acquisition phase, iterated a number of times N, following the second initialization phase, carry out the following sub-steps of:
  i) controlling the charge of the detection capacitor over a second predefined duration, then
  ii) controlling the discharge of the detection capacitor over the second predefined duration, then
  iii) controlling the transfer of charge from the storage capacitor to the detection capacitor in order to obtain a voltage value across the terminals of the storage capacitor by analog-to-digital conversion, and e) determine the value of a detection parameter, which is equal to the difference between a first average and a second average, where the first average is defined by the average of the voltage values which are obtained at the end of each iteration of the first acquisition phase, and where the second average is defined by the average of the voltage values at the end of each iteration of the second acquisition phase, and f) compare the difference between the first determined average and the second determined average with a predefined detection threshold.

In the disclosure of an aspect of the invention and the description of the figures, a detection capacitor and a storage capacitor have been mentioned. A person skilled in the art understands that a detection capacitor device and a storage capacitor device may equivalently be spoken of. Likewise, the value of the capacitor or, equivalently, the capacitance of the capacitor device, may be spoken of.

It is implicitly understood that, in an aspect of the invention, the value of the storage capacitor Cext is equal to the value of the detection capacitor Ce, in the absence of a human presence in proximity to the sensor. This is a conventional feature of the storage capacitor, in the field of an aspect of the invention. Throughout the text, there is considered to be an absence of a human presence in proximity to the sensor in the absence of a human presence in a radius of 50 cm around the sensor, or even a radius of 20 cm.

In other words, in step b), the discharge of the detection capacitor is controlled, with said discharge which is implemented for a time interval of a duration which is equal to the first predefined duration, then the charge of the detection capacitor is controlled, with said charge which is implemented for a time interval of a duration which is equal to this same first determined duration.

Similarly, in step d), the charge of the detection capacitor is controlled, with said charge which is implemented for a time interval of a duration which is equal to the second predefined duration, then the discharge of the detection capacitor is controlled, with said discharge which is implemented for a time interval of a duration which is equal to this same second determined duration.

In step b), the sub-steps are advantageously implemented immediately after one another. In the same way, in step d), the sub-steps are advantageously implemented immediately after one another.

Thus, the sensor and the microcontroller make it possible to determine a human presence without, however, the presence of moisture in the surroundings of the sensor interfering with the measurements carried out by said sensor. Specifically, the first acquisition phase and the second acquisition phase make it possible to eliminate the influence of the presence of water on the detection measurements carried out by the microcontroller.

Advantageously, step f) includes detecting a human presence, when the difference between the first determined average and the second determined average is above a predefined detection threshold. In other words, step f) comprises, then, providing information relating to the presence of an individual, when said difference is above the predefined detection threshold. The sensor according to an aspect of the invention thus makes it possible to carry out measurements for detecting a human presence in proximity.

An aspect of the invention also concerns a vehicle comprising a sensor and a microcontroller as was presented above.

Thus, when the sensor is mounted, for example, in the handles of opening elements of the vehicle, the sensor and the microcontroller make it possible to prevent false detections caused by the presence of moisture in the surroundings of the vehicle.

Finally, an aspect of the invention also concerns a method implemented by the microcontroller of the sensor as was presented above, the method being noteworthy in that it comprises:
  a) a first initialization phase, in which a voltage, the value of which is equal to half of the voltage delivered by the DC voltage generator, is applied across the terminals of the detection capacitor,
  b) a first acquisition phase, iterated a number of times N, N being a natural number which is greater than or equal to three, following the first initialization phase, comprising the following sub-steps of:
    i) controlling the discharge of the detection capacitor over a first predefined duration, then
    ii) controlling the charge of the detection capacitor over said first predefined duration, then
    iii) controlling the transfer of the charge from the detection capacitor to the storage capacitor in order to obtain a voltage value across the terminals of the storage capacitor by analog-to-digital conversion,
  c) a second initialization phase, following the first acquisition phase, in which a voltage the value of which is equal to half of the voltage delivered by the DC voltage generator is applied across the terminals of the detection capacitor,
  d) a second acquisition phase, iterated a number of times N, following the second initialization phase, comprising the following sub-steps of:
    i) controlling the charge of the detection capacitor over a second predefined duration,
    ii) controlling the discharge of the detection capacitor over the second predefined duration,
    iii) controlling the transfer of charge from the storage capacitor to the detection capacitor in order to obtain a voltage value across the terminals of the detection capacitor by analog-to-digital conversion,
  e) determining the value of a detection parameter, which is equal to the difference between a first average and a second average, where the first average is defined by the average of the voltage values which are obtained at the end of each iteration of the first acquisition phase, and where the second average is defined by the average of the voltage values at the end of each iteration of the second acquisition phase, and
  f) comparing, on the one hand, the difference between the first determined average and the second determined average with, on the other hand, a predefined detection threshold.

In other words, in step b), the discharge of the detection capacitor is controlled, with said discharge which is implemented for a time interval of a duration which is equal to the first predefined duration, then the charge of the detection capacitor is controlled, with said charge which is implemented for a time interval of a duration which is equal to this same first determined duration.

Similarly, in step d), the charge of the detection capacitor is controlled, with said charge which is implemented for a time interval of a duration which is equal to the second predefined duration, then the discharge of the detection capacitor is controlled, with said discharge which is implemented for a time interval of a duration which is equal to this same second determined duration.

In step b), the sub-steps are advantageously implemented immediately after one another. In the same way, in step d), the sub-steps are advantageously implemented immediately after one another.

Advantageously, step f) includes detecting a human presence, when the difference between the first determined average and the second determined average is above a predefined detection threshold. In other words, step f) comprises, then, providing information relating to the presence of an individual, when said difference is above the predefined detection threshold. The method according to an aspect of the invention forms, then, a method for detecting a human presence in proximity to a sensor as was presented above.

An aspect of the invention also concerns a computer program product which is noteworthy in that it comprises a set of program code instructions which, when they are executed by one or more processors, configure the one or more processors to implement a method as was presented above. The one or more processors belong to the microcontroller of the sensor according to an aspect of the invention.

BRIEF DESCRIPTION OF THE DRAWINGS

Other features and advantages of aspects of the invention will become more apparent upon reading the following description. This description is purely illustrative and should be read with reference to the appended drawings, in which:

FIG. 4 shows the variation in the voltage across the terminals of the detection capacitor and the variation in the voltage across the terminals of the capacitor of the equivalent model of water during the second initialization phase of the method according to FIG. 2.

DETAILED DESCRIPTION OF THE PREFERRED EMBODIMENTS

The sensor according to an aspect of the invention is a capacitive proximity sensor intended to be mounted in a motor vehicle in order to make it possible to detect a human presence in proximity to said sensor with the aim of performing a function of the vehicle. The sensor may notably be mounted in a door handle or in a rear trunk of a motor vehicle in order to detect the presence of a user so as to make it possible to unlock the opening elements of the vehicle.

Figure 1:
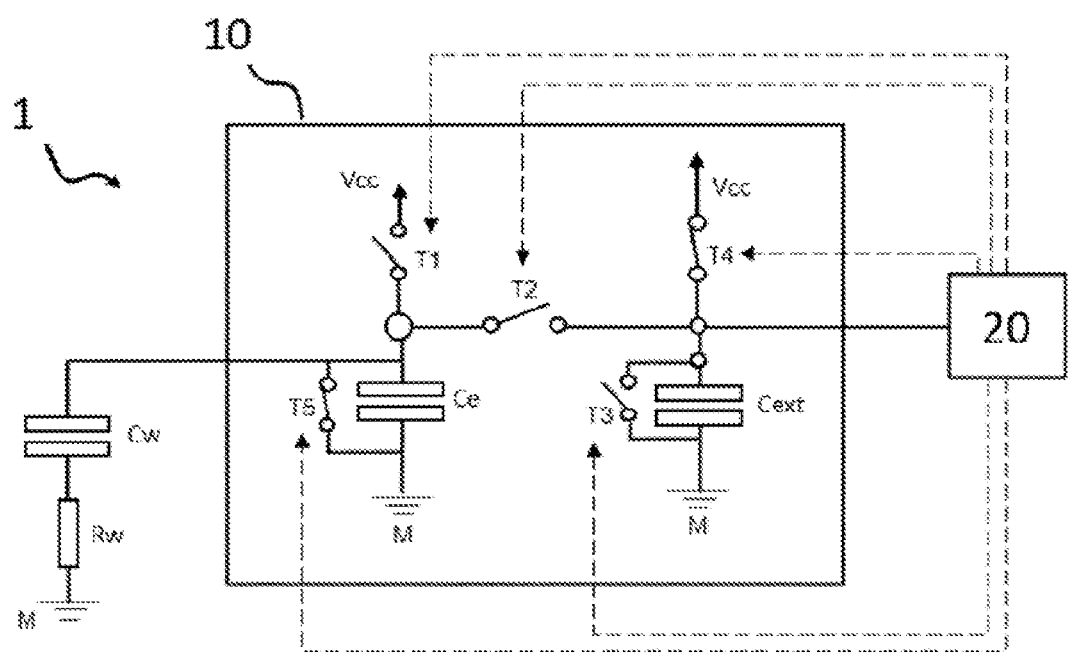
FIG. 1 schematically illustrates a sensor and a microcontroller according to an aspect of the invention.

FIG. 1 shows an example of an electronic circuit of the sensor 1 according to an aspect of the invention. The sensor 1 comprises a detection circuit 10 and a microcontroller 20.

In this example, the detection circuit 10 is of DCVD (Differential Capacitive Voltage Divider) type.

The detection circuit 10 comprises a first electrode connected to a printed circuit comprising a capacitor referred to as a "detection" capacitor, labeled Ce, and a capacitor referred to as a "storage" capacitor, labeled Cext. A first switch T1 is arranged between the positive terminal of a voltage generator Vcc and a first terminal of the detection capacitor Ce. A second switch T2 is arranged between the first terminal of the detection capacitor Ce and a first terminal of the storage capacitor Cext, the second terminals of the detection capacitor Ce and of the storage capacitor Cext, respectively, as well as the negative terminal of the voltage generator Vcc being connected to ground M. A third switch T3 is connected between the first terminal and the second terminal of the storage capacitor Cext, that is to say in parallel with the storage capacitor Cext.

A fourth switch T4 is connected on the one hand to the supply voltage generator Vcc and on the other hand to the first terminal of the storage capacitor Cext. A fifth switch T5 is connected on the one hand to the first terminal of the detection capacitor and on the other hand to the second terminal of the detection capacitor Ce.

The first terminal of the storage capacitor Cext is electrically connected to the microcontroller 20.

The microcontroller 20 implements an analog-to-digital converter ADC, making it possible to quantify the voltage stored in the storage capacitor Cext.

The microcontroller 20 is configured to control the switches T1, T2, T3, T4, T5 of the detection circuit 10 in order to periodically charge the detection capacitor Ce, then discharge it into the storage capacitor Cext, and to measure the voltage across the terminals of the storage capacitor Cext in order to detect or not detect a human presence in proximity to the sensor 1.

In addition, when the vehicle is in moist surroundings, notably when it is raining, the presence of water or moisture in the surroundings of the vehicle is electronically modeled by a capacitor Cw and a resistor Rw which are connected in series with one another and the assembly of which is connected on a branch from the detection capacitor Ce.

Implementation

Figure 2:
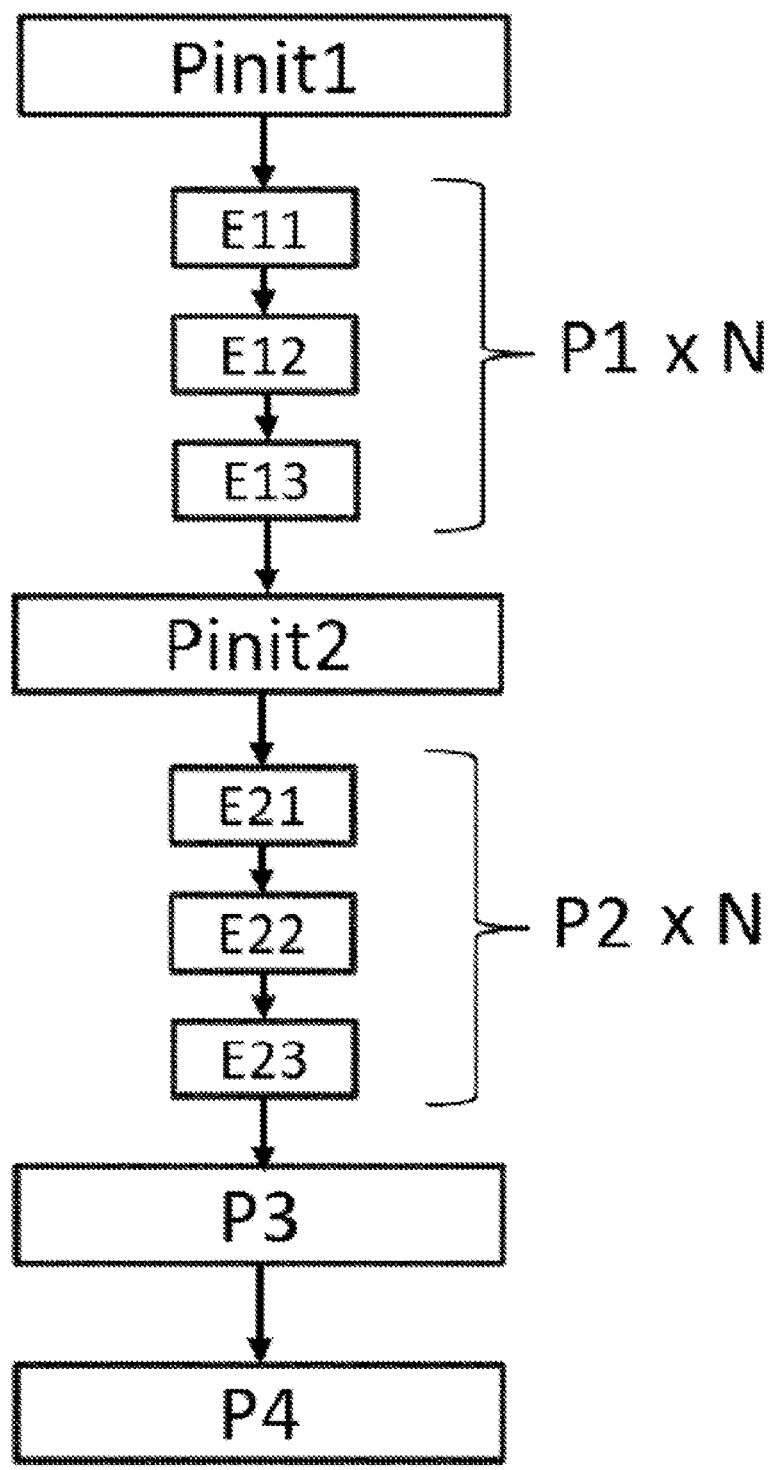
FIG. 2 shows the method for detecting a human presence according to an aspect of the invention.

With reference to FIG. 2, one embodiment of the method for detecting a human presence according to an aspect of the invention, implemented by the microcontroller 20, will now be presented.

Before the implementation of the method, the second switch T2, the third switch T3 and the fifth switch T5 are closed and the first switch T1 and the fourth switch T4 are open.

The method first of all comprises a first initialization phase Pinit1.

Figure 3:
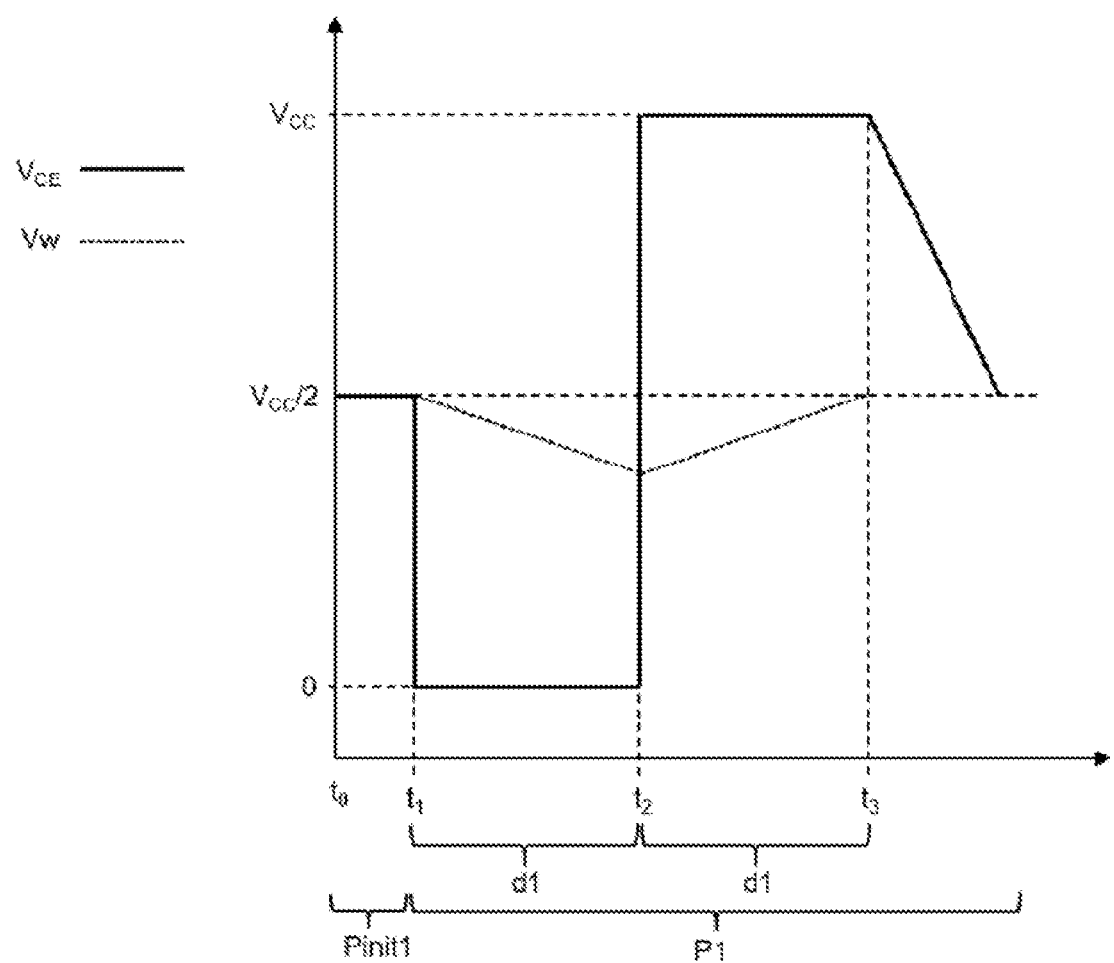
FIG. 3 shows the variation in the voltage across the terminals of the detection capacitor and the variation in the voltage across the terminals of the capacitor of the equivalent model of water during the first initialization phase of the method according to FIG. 2.

With reference to FIG. 3, the first initialization phase Pinit1 is defined between an initial instant t0 and a first instant t1, which is defined after the initial instant t0.

The first initialization phase Pinit1 comprises a sub-step of controlling the discharge of the detection capacitor Ce over a predefined time period, followed by a sub-step of controlling the charge of the detection capacitor Ce over said time period, followed by a sub-step of controlling the transfer of the charge from the detection capacitor Ce to the storage capacitor Cext so that the voltage applied across the terminals of the detection capacitor Ce is equal, in the absence of a human presence in proximity to the sensor, to half of the voltage delivered by the DC voltage generator Vcc. The same voltage is also applied across the terminals of the capacitor Cw of the equivalent model of water. The predefined time period is in the order of ten microseconds.

More specifically, during the sub-step of controlling the discharge, the microcontroller 20 controls the second switch T2 so as to open, for the predefined time period. The predefined time period is in the order of ten microseconds. The third switch T3 and the fifth switch T5 are closed and the first switch T1 and the fourth switch T4 are open.

During the sub-step of controlling the charge, the microcontroller 20 controls the first switch T1 so as to close and the fifth switch T5 so as to open (the second switch T2 and the fourth switch T4 already being open and the third switch T3 already being closed) for the predefined time period. This makes it possible for the detection capacitor Ce to be charged by the voltage generator Vcc.

During the sub-step of controlling the transfer of the charge from the detection capacitor Ce to the storage capacitor Cext, the microcontroller 20 controls the first switch T1 and the third switch T3 so as to open and the second switch T2 so as to close (the fourth and fifth switches T4, T5 being open), this making it possible to transfer the charge from the detection capacitor Ce to the storage capacitor Cext by current conduction.

It is implicitly understood that the feature according to which the voltage value across the terminals of the detection capacitor is equal, in the absence of a human presence in proximity to the sensor, to half of the voltage delivered by the DC voltage generator Vcc, is obtained by construction, by virtue:

of the preceding steps of discharging the detection capacitor Ce, of charging the detection capacitor Ce, and of transferring charge between the two capacitors by placing the latter in series and connecting to ground (see preceding paragraph); and of the identical values taken by the capacitors Ce and Cext, in the absence of a human presence in proximity to the sensor.

Following the first initialization phase Pinit1, the method comprises a first acquisition phase P1 comprising a sub-step of controlling the discharge E11 of the detection capacitor Ce over a predefined duration d1, followed by a sub-step of controlling the charge E12 of the detection capacitor Ce over said predefined duration d1, followed by a sub-step of controlling the transfer E13 of the charge from the detection capacitor Ce to the storage capacitor Cext so as to obtain a voltage value across the terminals of the storage capacitor Cext by analog-to-digital conversion.

The predefined duration d1 is in the order of ten microseconds.

More specifically, during the sub-step of controlling the discharge E11, the microcontroller 20 controls the second switch T2 so as to open and the third switch T3 and the fifth switch T5 so as to close from the first instant t1 for the predefined duration d1 until a second instant t2. The first switch T1 and the fourth switch T4 are open.

With reference to FIG. 3, during the step E11, the voltage Vce across the terminals of the detection capacitor Ce decreases until the value of the voltage is zero. In addition, the voltage Vw of the capacitor Cw of the electronic equivalent model of water also decreases.

More specifically, the value of the voltage Vw at the second instant t2 is equal to the following voltage:

$$Vw(t2) = \frac{Vcc}{2} * e^{-\frac{d1}{\sigma_{water}}}$$

wherein $\sigma_{water}$ corresponds to the time constant of water.

During the sub-step of controlling the charge E12, the microcontroller 20 controls the first switch T1 so as to close and the fifth switch T5 so as to open (the second switch T2 and the fourth switch T4 already being open and the third switch T3 already being closed), from the second instant t2 for the predefined duration d1, until a third instant t3. This makes it possible for the detection capacitor Ce to be charged by the voltage generator Vcc.

Thus the voltage Vce across the terminals of the detection capacitor Ce increases until the voltage delivered by the voltage generator Vcc. In addition, the voltage Vw of the capacitor Cw of the electronic equivalent model of water also increases. More specifically, again, the value of the voltage Vw at the third instant t3 is equal to the following voltage:

$$Vw(t3) = Vw(t2) + (Vcc - Vw(t2)) * \left(1 - e^{-\frac{d1}{\sigma_{water}}}\right)$$

$$Vw(t3) = Vcc * \left(1 - e^{-\frac{d1}{\sigma_{water}}}\right) + Vw(t2) * e^{-\frac{d1}{\sigma_{water}}}$$

$$Vw(t3) = Vcc * \left(1 - e^{-\frac{d1}{\sigma_{water}}}\right) + \frac{Vcc}{2} * e^{-\frac{d1}{\sigma_{water}}} * e^{-\frac{d1}{\sigma_{water}}}$$

Thus, at the third instant t3, as $d1 < \sigma_{water}$, the voltage Vw(t3) is almost equal to $$\frac{Vcc}{2}.$$

In other words, the voltage Vw is again equal to the value of the voltage applied to the capacitor Cw for the first initialization phase Pinit1, in other words to half of the voltage delivered by the DC voltage generator Vcc, in the absence of a human presence in proximity to the sensor. Specifically, as the sub-step of controlling the discharge E11 and the sub-step of controlling the charge E12 are of equal duration, the capacitor Cw of the equivalent model of water discharges as much as it charges. Thus, the capacitor Cw does not influence the value of the voltage of the detection capacitor Ce.

During the sub-step of controlling the transfer E13 of the charge from the detection capacitor Ce to the storage capacitor Cext, the microcontroller 20 controls the first switch T1 and the third switch T3 so as to open and the second switch T2 so as to close (the fourth and fifth switches T4, T5 being open), this making it possible to transfer the charge from the detection capacitor Ce to the storage capacitor Cext by current conduction.

At the end of each sub-step of controlling the transfer E13, the microcontroller 20 obtains the value of the voltage across the terminals of the storage capacitor Cext by carrying out an analog-to-digital conversion. In other words, the voltage across the terminals of the storage capacitor Cext is then determined by carrying out an analog-to-digital conversion, for example in the microcontroller 20.

In addition, the first acquisition phase P1 is iterated a number of times N, N being a natural number which is greater than or equal to 3. Preferably, the first acquisition phase P1 is carried out four times.

With reference to FIG. 2, following the last iteration of the first acquisition phase P1, the method comprises a second initialization step Pinit2.

With reference to FIG. 4, the second initialization phase Pinit2 is defined between a fourth instant t4 and a fifth instant t5, which is defined after the fourth instant t4. The second initialization phase Pinit2 comprises a sub-step of controlling the charge of the detection capacitor Ce over a second predefined time period, followed by a sub-step of controlling the discharge of the detection capacitor Ce over said second predefined time period, followed by a sub-step of controlling the transfer of charge from the storage capacitor Cext to the detection capacitor Ce so that the voltage applied across the terminals of the detection capacitor Ce is equal to half of the voltage delivered by the DC voltage generator Vcc, in the event that the value of the detection capacitor Ce is equal to the value of the storage capacitor Cext (in the absence of a human presence in proximity to the sensor). The same voltage is thus applied across the terminals of the capacitor Cw of the equivalent model of water. The second predefined time period is in the order of ten microseconds, and notably equal to the value of the first time period.

More specifically, during the sub-step of controlling the charge, the microcontroller 20 controls the first switch T1 and the fourth switch T4 so as to close and the second switch T2 so as to open (the third switch T3 and the fifth switch T5 being open) for the second time period.

During the sub-step of controlling the discharge, the microcontroller 20 controls the first switch T1 so as to open (the second switch T2 and the third switch T3 already being open) and the fifth switch T5 so as to close (the fourth switch T4 already being closed) for the second time period.

During the sub-step of controlling the transfer of charge from the storage capacitor Cext to the detection capacitor Ce, the microcontroller 20 controls the fourth switch T4 and the fifth switch T5 so as to open and the second switch T2 so as to close (the first switch T1 and the third switch T3 being open).

It is implicitly understood that the feature according to which the voltage value across the terminals of the detection capacitor is equal, in the absence of a human presence in proximity to the sensor, to half of the voltage delivered by the DC voltage generator Vcc, is obtained by construction, by virtue:

of the preceding steps of charging the detection capacitor Ce, of discharging the detection capacitor Ce, and of transferring charge between the two capacitors by placing the latter in series and connecting to ground (see preceding paragraph); and of the identical values taken by the capacitors Ce and Cext, in the absence of a human presence in proximity to the sensor.

Following the second initialization phase Pinit2, the method comprises a second acquisition phase P2 comprising a sub-step of controlling the charge E21 of the detection capacitor Ce over a second predefined duration d2, followed by a sub-step of controlling the discharge E22 of the detection capacitor Ce simultaneously with the charge of the storage capacitor Cext over the second predefined duration d2, followed by a sub-step of controlling the transfer E23 of the charge from the storage capacitor Cext to the detection capacitor Ce so as to obtain a voltage value across the terminals of the storage capacitor Cext by analog-to-digital conversion.

The second predefined duration d2 is in the order of ten microseconds. Preferably, the second duration d2 is equal to the first duration d1.

More specifically, during the sub-step of controlling the charge E21, the microcontroller 20 controls the first switch T1 and the fourth switch T4 so as to close and the second switch T2 so as to open (the third switch T3 and the fifth switch T5 being open) from the fifth instant t5 for the second predefined duration d2, until a sixth instant t6.

During this step E21, the voltage Vce across the terminals of the detection capacitor Ce increases until the value of the voltage Vce is equal to the voltage delivered by the voltage generator Vcc. In addition, the voltage Vw of the capacitor Cw of the electronic equivalent model of water also increases, since the capacitor Cw is charging.

More specifically, the value of the voltage Vw at the sixth instant t6 is equal to the following voltage:

$$Vw(t6) = \frac{Vcc}{2} * \left(2 - e^{-\frac{d2}{\sigma_{water}}}\right).$$

During the sub-step of controlling the discharge E22, the microcontroller 20 controls the first switch T1 so as to open (the second switch T2 and the third switch T3 already being open) and the fifth switch T5 so as to close (the fourth switch T4 already being closed) from the sixth instant t6 for the second predefined duration d2, until a seventh instant t7.

During this step E22, the voltage Vce across the terminals of the detection capacitor Ce decreases until the value of the voltage Vce is zero. In addition, the voltage Vw of the capacitor Cw of the electronic equivalent model of water also decreases.

More specifically, again, the value of the voltage Vw at the seventh instant t7 is equal to the following voltage:

$$Vw(t7) = Vw(t6) * \left(e^{-\frac{d2}{\sigma_{water}}}\right)$$

$$Vw(t7) = \frac{Vcc}{2} * \left(2 - e^{-\frac{d2}{\sigma_{water}}}\right) * \left(e^{-\frac{d2}{\sigma_{water}}}\right)$$

-continued $$Vw(t7) = Vcc * \left(e^{-\frac{d2}{\sigma_{water}}}\right) - \frac{Vcc}{2} * \left(e^{-\frac{d2}{\sigma_{water}}}\right) * \left(e^{-\frac{d2}{\sigma_{water}}}\right)$$

Thus, at the seventh instant t7, as d2<$\sigma_{water}$, the voltage Vw(t7) is almost equal to $$\frac{Vcc}{2}.$$

In other words, the voltage Vw is again equal to the value of the voltage applied to the capacitor Cw for the second initialization phase Pinit2, in other words to half of the voltage delivered by the DC voltage generator Vcc, in the absence of a human presence in proximity to the sensor. Specifically, as the sub-step of controlling the charge E12 and the sub-step of controlling the discharge E22 are of equal duration, the capacitor Cw of the equivalent model of water charges as much as it discharges. Thus, the capacitor Cw does not influence the value of the voltage of the detection capacitor Ce.

During the sub-step of controlling the transfer E23 of charge from the storage capacitor Cext to the detection capacitor Ce, the microcontroller 20 controls the fourth switch T4 and the fifth switch T5 so as to open and the second switch T2 so as to close (the first switch T1 and the third switch T3 being open) in order to discharge the storage capacitor Cext into the detection capacitor Ce.

At the end of each sub-step of controlling the transfer E23, the microcontroller 20 then determines the voltage across the terminals of the storage capacitor Cext by carrying out an analog-to-digital conversion.

In addition, the second acquisition phase P2 is iterated a number of times N, N being a natural number which is greater than or equal to 3. Preferably, the second acquisition phase P2 is carried out four times.

Once the first acquisition phase P1 and the second acquisition phase P2 have been carried out, the method comprises a step of calculating P3 a detection parameter, during which the microcontroller 20 determines the difference between a first average, which is equal to the average of the voltage values which are obtained at the end of each iteration of the first acquisition phase P1, and a second average, which is equal to the average of the voltage values which are obtained at the end of each iteration of the second acquisition phase P2.

Following the calculation step P3, the microcontroller 20 analyzes the difference between the first determined average, which increases in the event of the presence of a user in proximity to the sensor 1, and the second determined average, which decreases in the event of the presence of a user in proximity to the sensor 1. The method then comprises a step P4 of comparing, on the one hand, the difference between the first determined average and the second determined average with, on the other hand, a predefined detection threshold. The step P4 advantageously includes providing information relating to the presence or the absence of a human operator in proximity to the sensor 1 (detection of a human presence), when the difference between the first determined average and the second determined average is above a predefined detection threshold.

Thus, the method implemented by the microcontroller 20 makes it possible to prevent the presence of moisture in the surroundings of the sensor 1 from interfering with the measurements carried out by said sensor 1, notably by nullifying the influence of the capacitor Cw of the equivalent model on the capacitance of the storage capacitor Cext or of the detection capacitor Ce and being able to influence the measurements carried out by the microcontroller 20.

The invention claimed is:

1. A capacitive proximity sensor comprising:
a detection circuit, provided with a measurement electrode forming a detection capacitor, with a storage capacitor and with switches, where the value of the storage capacitor is equal to the value of the detection capacitor, in the absence of a human presence in proximity to the sensor,
a DC voltage generator, which is able to be connected to the detection capacitor and/or to the storage capacitor device, and
a microcontroller configured to control the switches of the detection circuit, with a first switch which is able to connect the detection capacitor to the DC voltage generator, a second switch which is able to connect the detection capacitor and the storage capacitor in series, a third switch which is able to short the storage capacitor, a fourth switch which is able to connect the storage capacitor to the DC voltage generator, and a fifth switch which is able to short the detection capacitor, the microcontroller configured to:
a) during a first initialization phase, control the switches so as to transfer charge between the detection capacitor and the storage capacitor, so that a voltage across the terminals of the detection capacitor is equal to a voltage across the terminals of the storage capacitor, and is equal, in the absence of a human presence in proximity to the sensor, to half of the voltage delivered by the DC voltage generator,
b) during a first acquisition phase, iterated a number of times N, N being a natural number which is greater than or equal to three, following the first initialization phase, carry out the following sub-steps of:
  i) controlling the discharge of the detection capacitor over a first predefined duration, then
  ii) controlling the charge of the detection capacitor over said first predefined duration, then
  iii) controlling the transfer of the charge from the detection capacitor to the storage capacitor, then measuring a voltage value across the terminals of the storage capacitor by analog-to-digital conversion,
c) during a second initialization phase, following the first acquisition phase, control the switches so as to transfer charge between the detection capacitor and the storage capacitor, so that a voltage across the terminals of the detection capacitor is equal to a voltage across the terminals of the storage capacitor, and is equal, in the absence of a human presence in proximity to the sensor, to half of the voltage delivered by the DC voltage generator,
d) during a second acquisition phase, iterated a number of times N, following the second initialization phase, carry out the following sub-steps of:
  i) controlling the charge of the detection capacitor over a second predefined duration, then
  ii) controlling the discharge of the detection capacitor over the second predefined duration, then
  iii) controlling the transfer of charge from the storage capacitor to the detection capacitor, then measuring a voltage value across the terminals of the storage capacitor by analog-to-digital conversion,
e) determine the value of a detection parameter, which is equal to the difference between a first average and a second average, where the first average is defined by the average of the voltage values which are measured at the end of each iteration of the first acquisition phase, and where the second average is defined by the average of the voltage values which are measured at the end of each iteration of the second acquisition phase, and
f) compare the difference between the first determined average and the second determined average, with a predefined detection threshold.

2. A vehicle comprising a sensor and a microcontroller as claimed in claim 1.

3. A method implemented by the microcontroller of a sensor as claimed in claim 1, the method comprising:
a) a first initialization phase, in which the switches are controlled so as to transfer charge between the detection capacitor and the storage capacitor so that a voltage across the terminals of the detection capacitor is equal to a voltage across the terminals of the storage capacitor, and is equal, in the absence of a human presence in proximity to the sensor, to half of the voltage delivered by the DC voltage generator,
b) a first acquisition phase, iterated a number of times N, N being a natural number which is greater than or equal to three, following the first initialization phase, comprising the following sub-steps of:
  i) controlling the discharge of the detection capacitor over a first predefined duration, then
  ii) controlling the charge of the detection capacitor over said first predefined duration, then
  iii) controlling the transfer of the charge from the detection capacitor to the storage capacitor, then measuring a voltage value across the terminals of the storage capacitor by analog-to-digital conversion,
c) a second initialization phase, following the first acquisition phase, in which the switches are controlled so as to transfer charge between the detection capacitor and the storage capacitor, so that a voltage across the terminals of the detection capacitor is equal to a voltage across the terminals of the storage capacitor, and is equal, in the absence of a human presence in proximity to the sensor, to half of the voltage delivered by the DC voltage generator,
d) a second acquisition phase, iterated a number of times N, following the second initialization phase, comprising the following sub-steps of:
  i) controlling the charge of the detection capacitor over a second predefined duration, then
  ii) controlling the discharge of the detection capacitor over the second predefined duration, then
  iii) controlling the transfer of charge from the storage capacitor to the detection capacitor, then measuring a voltage value across the terminals of the storage capacitor by analog-to-digital conversion,
e) determining the value of a detection parameter, which is equal to the difference between a first average and a second average, where the first average is defined by the average of the voltage values which are measured at the end of each iteration of the first acquisition phase, and where the second average is defined by the average of the voltage values which are measured at the end of each iteration of the second acquisition phase, and
f) comparing, on the one hand, the difference between the first determined average and the second determined average with, on the other hand, a predefined detection threshold.

4. A computer program product, comprising a set of program code instructions which, when they are executed by one or more processors, configure the one or more processors to implement a method as claimed in claim 3.

* * * * *